United States Patent
Usuki et al.

(10) Patent No.: US 11,933,826 B2
(45) Date of Patent: Mar. 19, 2024

(54) EXECUTION DEVICE AND EXECUTION METHOD

(71) Applicant: Tokyo Electron Limited, Tokyo (JP)

(72) Inventors: Yuto Usuki, Miyagi (JP); Takayuki Hatanaka, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 124 days.

(21) Appl. No.: 17/469,513

(22) Filed: Sep. 8, 2021

(65) Prior Publication Data

US 2022/0074981 A1 Mar. 10, 2022

(30) Foreign Application Priority Data

Sep. 10, 2020 (JP) ................. 2020-151966

(51) Int. Cl.
| | | |
|---|---|---|
| *G01R 27/26* | (2006.01) | |
| *G01D 5/24* | (2006.01) | |
| *G01P 15/00* | (2006.01) | |
| *H01L 21/67* | (2006.01) | |
| *H01L 21/677* | (2006.01) | |

(52) U.S. Cl.
CPC .......... *G01R 27/2605* (2013.01); *G01D 5/24* (2013.01); *G01P 15/00* (2013.01); *H01L 21/67259* (2013.01); *H01L 21/67742* (2013.01)

(58) Field of Classification Search
CPC ....... G01R 27/2605; G01D 5/24; G01P 15/00; H01L 21/67259; H01L 21/67742; H01L 21/67253; H01L 21/67276
See application file for complete search history.

(56) References Cited

U.S. PATENT DOCUMENTS

| | | | |
|---|---|---|---|
| 2008/0102200 A1* | 5/2008 | Doki ................. | H01L 21/67259 118/712 |
| 2009/0033908 A1* | 2/2009 | Matsumoto ....... | H01L 21/67259 374/E1.001 |

FOREIGN PATENT DOCUMENTS

| | | |
|---|---|---|
| JP | 2017-183683 A | 10/2017 |
| JP | 2018-526614 A | 9/2018 |
| WO | 2016/205075 A1 | 12/2016 |

* cited by examiner

*Primary Examiner* — Amy He
(74) *Attorney, Agent, or Firm* — Studebaker & Brackett PC

(57) ABSTRACT

An execution device according to an exemplary embodiment includes an operation device, an acceleration sensor, and an arithmetic device. The operation device is a device for executing a predetermined operation. The acceleration sensor measures acceleration applied to the execution device. The arithmetic device measures an elapsed time after the acceleration measured by the acceleration sensor becomes a value within a reference range, and when a predetermined time elapses while the acceleration remains a value within the reference range, causes the operation device to execute the predetermined operation.

16 Claims, 12 Drawing Sheets

EXECUTION DEVICE AND EXECUTION METHOD

TECHNICAL FIELD

This application is based on and claims the benefit of priority from Japanese Patent Application No. 2020-151966 filed on Sep. 10, 2020 the entire contents of which is incorporated herein by reference.

Exemplary embodiments of the present disclosure relate to an execution device and an execution method.

BACKGROUND

Japanese Unexamined Patent Publication No. 2017-183683 discloses a measuring instrument that executes an operation for measuring an electrostatic capacitance. This measuring instrument includes a base board, a first sensor, a second sensor, and a circuit board. The first sensor includes a first electrode provided along an edge of a top surface of the base board. The second sensor includes a second electrode fixed on a bottom surface of the base board. The circuit board is mounted on the base board and is connected to the first sensor and the second sensor. The circuit board gives a high frequency signal to the first electrode and the second electrode, acquires a first measured value according to the electrostatic capacitance from a voltage amplitude at the first electrode, and acquires a second measured value according to the electrostatic capacitance from the voltage amplitude at the second electrode.

SUMMARY

In an exemplary embodiment, an execution device that is transported by a transport device provided in a semiconductor manufacturing apparatus and executes a predetermined operation, is provided. The execution device includes an operation device, an acceleration sensor, and an arithmetic device. The operation device is a device for executing a predetermined operation. The acceleration sensor measures acceleration applied to the execution device. The arithmetic device causes the operation device to execute a predetermined operation based on the acceleration measured by the acceleration sensor. The arithmetic device measures an elapsed time after the acceleration measured by the acceleration sensor becomes equal to or lower than a threshold value, determines that the execution device is transported to a predetermined position when a predetermined time elapses while the acceleration does not exceed the threshold value, and causes the operation device to operate a predetermined operation.

DETAILED DESCRIPTION

Figure 1:
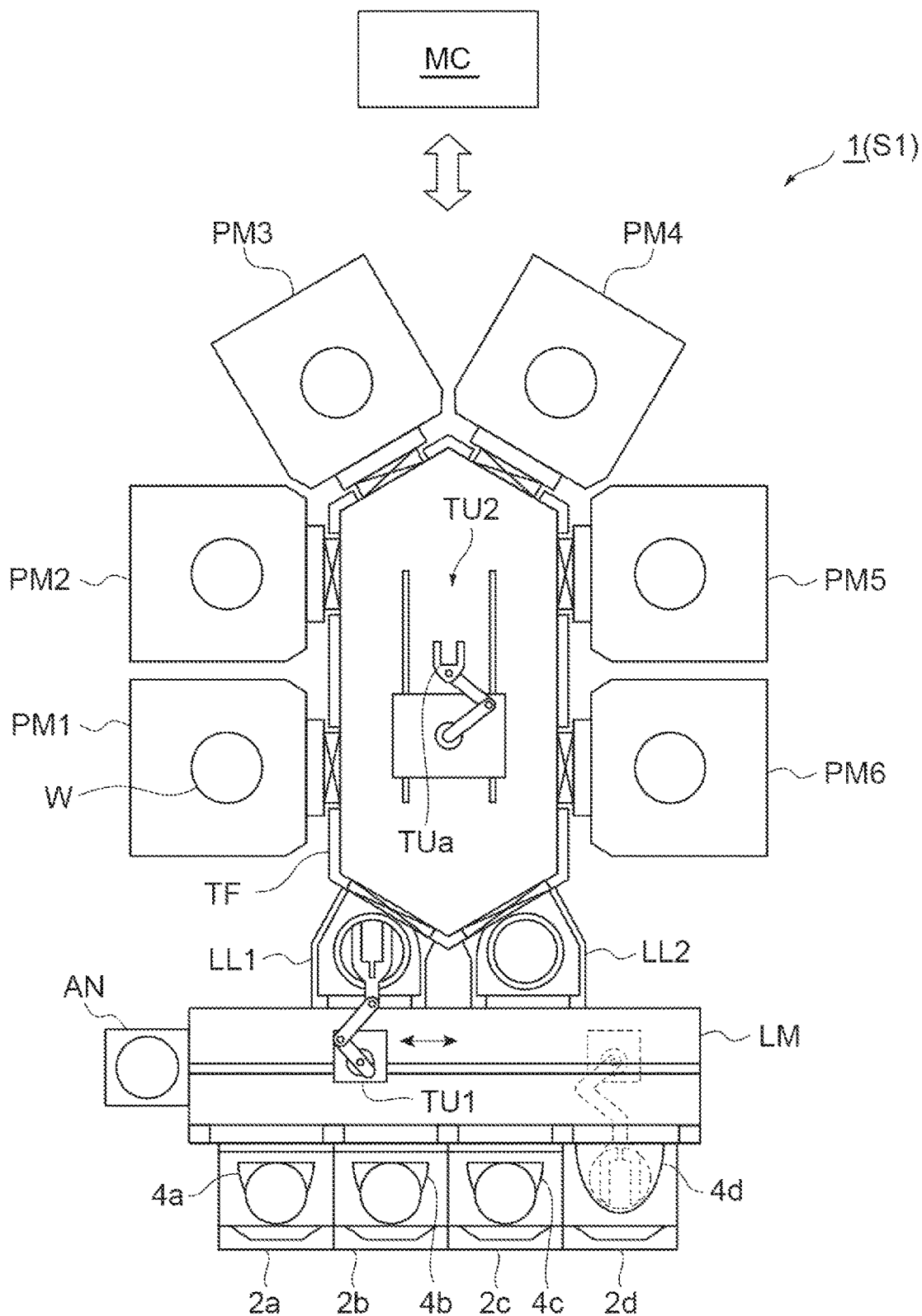
FIG. 1 is a diagram illustrating a processing system.

Hereinafter, various exemplary embodiments will be described.

In an exemplary embodiment, an execution device that is transported by a transport device provided in a semiconductor manufacturing apparatus and executes a predetermined operation, is provided. The execution device includes an operation device, an acceleration sensor, and an arithmetic device. The operation device is a device for executing a predetermined operation. The acceleration sensor measures acceleration applied to the execution device. The arithmetic device measures an elapsed time after the acceleration measured by the acceleration sensor becomes a value within a reference range, determines that the execution device is transported to a predetermined position when a predetermined time elapses while the acceleration remains a value within the reference range, and causes the operation device to execute the predetermined operation.

In the execution device in the embodiment described above, the acceleration applied to the execution device can be detected by the acceleration sensor provided in the execution device. For example, when the execution device is transported by the transport device of the semiconductor manufacturing apparatus, the acceleration is applied to the execution device according to a change in speed. In addition, in a state where the execution device is transported to the predetermined position, the execution device is stationary and the acceleration is not applied to the execution device. The arithmetic device can determine whether or not the acceleration caused by the movement by the transport device is applied to the execution device. When the predetermined time elapses in a state where the acceleration does not exceed the reference range, that is, in a state where the acceleration caused by the movement is not applied to the execution device, the arithmetic device can determine that the execution device is transported to the predetermined position. Based on this determination, the arithmetic device causes the operation device to operate a predetermined operation. Therefore, it is possible to cause the operation device to automatically execute the predetermined operation.

In an exemplary embodiment, when the acceleration exceeds the reference range within the predetermined time from start of measurement of the elapsed time, the arithmetic device may stop the measurement of the elapsed time and may return the elapsed time to the initial state.

In an exemplary embodiment, when the acceleration exceeds the reference range after the operation device executes the predetermined operation by the arithmetic device, the arithmetic device may determine that the execution device is transported out from the predetermined position, and may cause the operation device to stop the predetermined operation.

In another exemplary embodiment, an execution method of causing an execution device transported by a transport device provided in a semiconductor manufacturing apparatus to execute a predetermined operation, is provided. This method includes measuring the acceleration applied to the execution device and measuring the elapsed time after the measured acceleration becomes a value within the reference range. In addition, this method includes determining that the execution device is transported to a predetermined position and causing the operation device to operate a predetermined operation, when the predetermined time elapses while the acceleration does not exceed the reference range from start of measurement of the elapsed time.

In an exemplary embodiment, the execution method may further include stopping the measurement of the elapsed time and returning the elapsed time to an initial state when the acceleration exceeds the reference range within the predetermined time from the start of measurement of elapsed time.

In an exemplary embodiment, the execution method may further include determining that the execution device is transported out from the predetermined position when the acceleration exceeds the reference range after the operation device executes the predetermined operation, and causing the operation device to stop the predetermined operation.

In an exemplary embodiment, the acceleration sensor may include a first acceleration sensor configured to measure first acceleration in a first direction along the horizontal direction and a second acceleration sensor configured to measure second acceleration in a second direction that is orthogonal to the first direction along a horizontal direction. The acceleration may be a composite value of the first acceleration and the second acceleration.

In an exemplary embodiment, the reference range may be $-0.005$ m/s$^2$ to $0.005$ m/s$^2$.

In an exemplary embodiment, the predetermined time may be equal to or longer than 60 seconds.

In an exemplary embodiment, the predetermined operation may be measurement of an electrostatic capacitance.

Hereinafter, various embodiments will be described in detail with reference to the drawings. The same reference numerals will be given to the same or corresponding parts in each drawing.

The execution device according to one exemplary embodiment can be transported by a processing system 1 that has a function as a semiconductor manufacturing apparatus S1. First, a processing system that includes a processing device for processing the workpiece and a transport device for transporting the workpiece to the processing device will be described. FIG. 1 is a diagram illustrating a processing system. The processing system 1 includes tables 2a to 2d, containers 4a to 4d, a loader module LM, an aligner AN, a load lock modules LL1 and LL2, a process modules PM1 to PM6, a transfer module TF, and a controller MC. The number of tables 2a to 2d, the number of containers 4a to 4d, the number of load lock modules LL1 and LL2, and the number of process modules PM1 to PM6 are not limited, and any number of equal to or greater than one can be used.

The tables 2a to 2d are arranged along one edge of the loader module LM. The containers 4a to 4d are mounted on the tables 2a to 2d, respectively. Each of the containers 4a to 4d is, for example, a container called a front opening unified pod (FOUP). Each of the containers 4a-4d can be configured to accommodate the workpiece W. The workpiece W has a substantially disk shape like a wafer.

Inside of the loader module LM, there is a chamber wall that defines a transport space under atmospheric pressure. A transport device TU1 is provided in this transport space. The transport device TU1 is, for example, an articulated robot and is controlled by the controller MC. The transport device TU1 is configured to transport the workpiece W between the containers 4a to 4d and the aligner AN, between the aligner AN and the load lock modules LL1 to LL2, and between the load lock modules LL1 to LL2 and the containers 4a to 4d.

Figure 2:
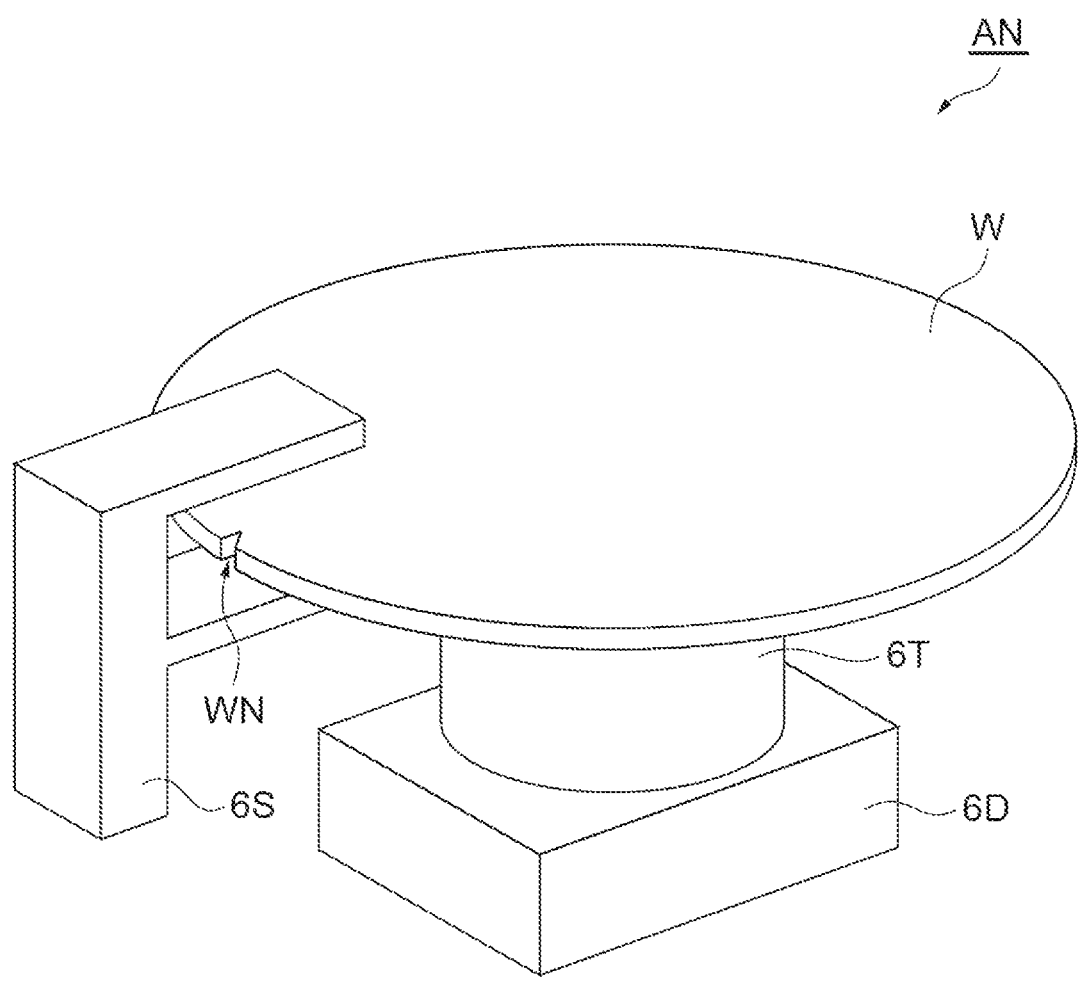
FIG. 2 is a perspective view illustrating an aligner.

The aligner AN is connected to the loader module LM. The aligner AN is configured to adjust the position of the workpiece W (calibrate the position). FIG. 2 is a perspective view illustrating an aligner. The aligner AN includes a support stand 6T, a drive device 6D, and a sensor 6S. The support stand 6T is a stand that can rotate around the axis extending in the vertical direction. The support stand 6T is configured to support the workpiece W. The support stand 6T is rotated by the drive device 6D. The drive device 6D is controlled by the controller MC. When the support stand 6T is rotated due to the power from the drive device 6D, the workpiece W placed on the support stand 6T is also rotated.

The sensor 6S is an optical sensor. The sensor 6S detects the edge of the workpiece W while the workpiece W is rotated. From the result of detecting the edge, the sensor 6S detects an amount of deviation of an angle position of a notch WN (or another marker) of the workpiece W with respect to a reference angle position and an amount of deviation of a center position of the workpiece W with respect to the reference position. The sensor 6S outputs the amount of deviation of the angle position of the notch WN and the amount of deviation of the center position of the workpiece W to the controller MC. The controller MC calculates an amount of rotation of the support stand 6T for correcting the angle position of the notch WN to the reference angle position based on the amount of deviation of the angle position of the notch WN. The controller MC controls the drive device 6D to rotate the support stand 6T as much as the amount of rotation. In this way, the angle position of the notch WN can be corrected to the reference angle position. In addition, the controller MC controls a position of an end effector of the transport device TU1 when receiving the workpiece W from the aligner AN based on the amount of deviation of the center position of the workpiece W. In this way, the center position of the workpiece W coincides with the predetermined position on the end effector of the transport device TU1.

Returning to FIG. 1, each of the load lock module LL1 and the load lock module LL2 is provided between the loader module LM and the transfer module TF. Each of the load lock module LL1 and the load lock module LL2 provides a preliminary decompression chamber.

The transfer module TF is air-tightly connected to the load lock module LL1 and the load lock module LL2 via a gate valve. The transfer module TF provides a decompression chamber capable of decompression. A transport device TU2 is provided in this decompression chamber. The transport device TU2 is, for example, an articulated robot having a transport arm TUa. The transport device TU2 is controlled by the controller MC. The transport device TU2 is configured to transport the workpiece W between the load lock modules LL1 to LL2 and the process modules PM1 to PM6, and between any two process modules of the process modules PM1 to PM6.

The process modules PM1 to PM6 are air-tightly connected to the transfer module TF via the gate valve. Each of the process modules PM1 to PM6 is a processing device configured to perform a dedicated process such as plasma processing on the workpiece W.

A series of operations when the processing on the workpiece W is performed in the processing system 1 will be illustrated as follows. The transport device TU1 of the loader module LM takes out the workpiece W from any of the containers 4a to 4d and transports the workpiece W to the aligner AN. Subsequently, the transport device TU1 takes out the position adjusted workpiece W from the aligner AN, and transports the workpiece W to one of the load lock module LL1 and the load lock module LL2. Next, one load lock module reduces the pressure in the preliminary decompression chamber to a predetermined pressure. Next, the transport device TU2 of the transfer module TF takes out the workpiece W from one of the load lock modules and transports the workpiece W to any of the process modules PM1 to PM6. Then, one or more process modules among the process modules PM1 to PM6 performs processing on the workpiece W. Then, the transport device TU2 transports the processed workpiece W from the process module to one of the load lock module LL1 and the load lock module LL2. Next, the transport device TU1 transports the workpiece W from one of the load lock modules to any of the containers 4a to 4d.

This processing system 1 includes the controller MC as described above. The controller MC can be a computer including a processor, a storage device such as a memory, a display device, an input/output device, a communication device, and the like. The series of operations of the processing system 1 described above are realized by controlling each part of the processing system 1 by the controller MC according to the program stored in the storage device.

Figure 3:
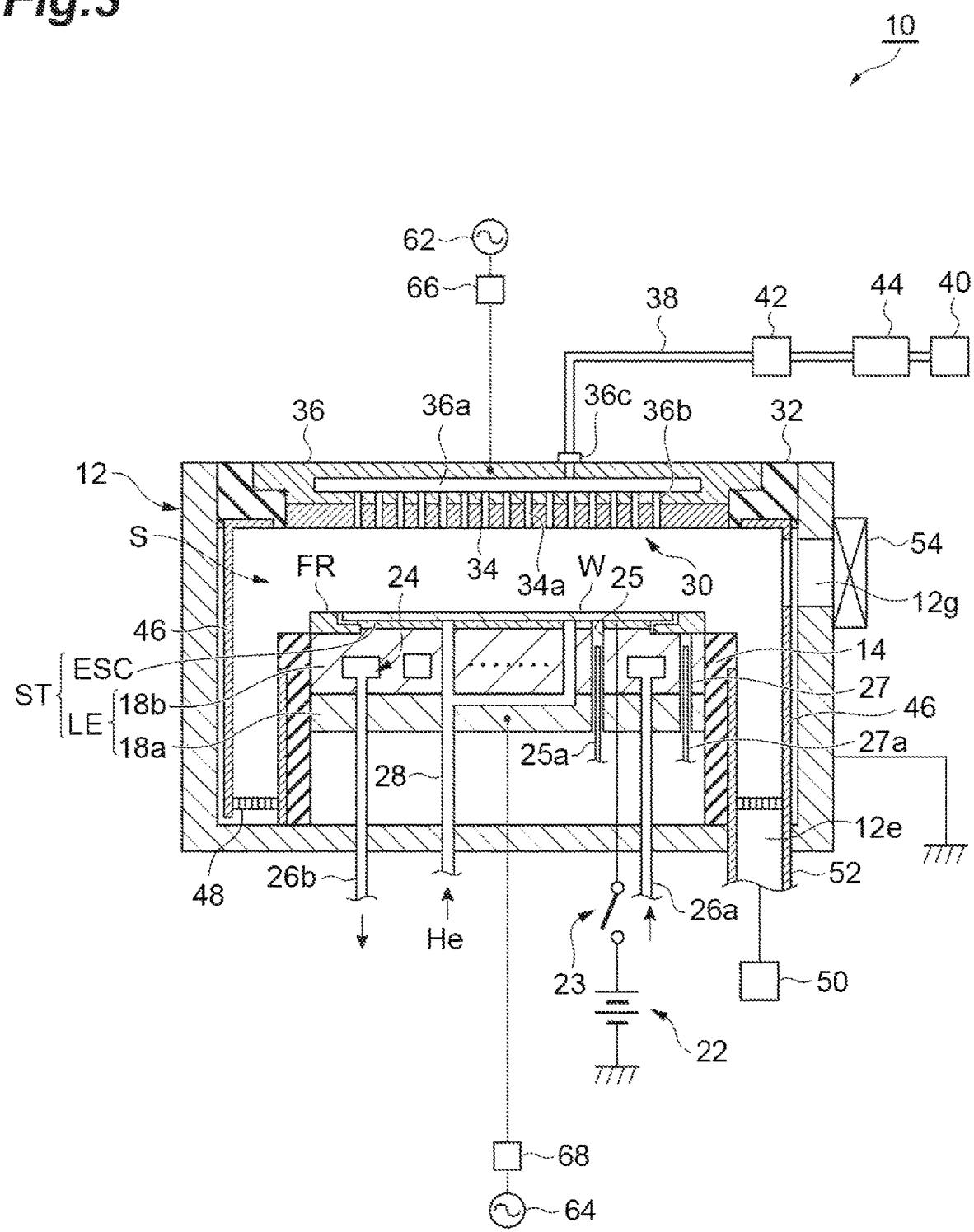
FIG. 3 is a diagram illustrating an example of a plasma processing device.

FIG. 3 is a diagram illustrating an example of a plasma processing device that can be adopted as any of the process modules PM1 to PM6. A plasma processing device 10 illustrated in FIG. 3 is a capacitance-coupling type plasma etching device. The plasma processing device 10 includes a chamber 12 having a substantially cylindrical shape. The chamber 12 is made of, for example, aluminum, and the inner wall surface thereof may be anodized. This chamber 12 is grounded for security.

A support portion 14 having a substantially cylindrical shape is provided on a bottom portion of the chamber 12. The support portion 14 is formed of, for example, an insulating material. The support portion 14 is provided in the chamber 12. The support portion 14 extends upward from the bottom portion of the chamber 12. In addition, a stage ST is provided in a chamber S provided by the chamber 12. The stage ST is supported by the support portion 14.

The stage ST includes a lower electrode LE and an electrostatic chuck ESC. The lower electrode LE includes a first plate 18a and a second plate 18b. The first plate 18a and the second plate 18b are formed of a metal such as aluminum, and have a substantially disk shape. The second plate 18b is provided on the first plate 18a and is electrically connected to the first plate 18a.

The electrostatic chuck ESC is provided on the second plate 18b. The electrostatic chuck ESC has a structure in which an electrode, which is a conductive film, is arranged between a pair of insulating layers or insulating sheets, and has a substantially disk shape. A DC power supply 22 is electrically connected to the electrode of the electrostatic chuck ESC via a switch 23. This electrostatic chuck ESC adsorbs the workpiece W by an electrostatic force such as a Coulomb force generated by a DC voltage from the DC power supply 22. In this way, the electrostatic chuck ESC can hold the workpiece W.

A focus ring (edge ring) FR is provided on a peripheral edge of the second plate 18b. This focus ring FR is provided to surround the edge of the workpiece W and the electrostatic chuck ESC. The focus ring FR has a first portion P1 and a second portion P2 (refer to FIG. 7). The first portion P1 and the second portion P2 have an annular plate shape. The second portion P2 is a portion outside the first portion P1. The second portion P2 has a larger thickness in the height direction than the first portion P1. An inner edge P2i of the second portion P2 has a diameter larger than the diameter of an inner edge P1i of the first portion P1. The workpiece W is mounted on an electrostatic chuck ESC such that the edge region is positioned on the first portion P1 of the focus ring FR. The focus ring FR can be formed of any of various materials such as silicon, silicon carbide, and silicon oxide.

A refrigerant flow path 24 is provided inside the second plate 18b. The refrigerant flow path 24 configures a temperature control mechanism. Refrigerant is supplied to the refrigerant flow path 24 from a chiller unit provided outside the chamber 12 via a pipe 26a. The refrigerant supplied to the refrigerant flow path 24 is returned to the chiller unit via the pipe 26b. As described above, the refrigerant is circulated between the refrigerant flow path 24 and the chiller unit. The temperature of the workpiece W supported by the electrostatic chuck ESC is controlled by controlling the temperature of this refrigerant.

A plurality of (for example, three) through holes 25 penetrating the stage ST are formed in the stage ST. The plurality of through holes 25 are formed inside the electrostatic chuck ESC in a plan view. A lift pin 25a is inserted into each of these through holes 25. In FIG. 3, one through hole 25 into which one lift pin 25a is inserted is drawn. The lift pin 25a is provided to be vertically movable in the through hole 25. When the lift pin 25a rises, the workpiece W supported on the electrostatic chuck ESC rises.

In the stage ST, a plurality of (for example, three) through holes 27 penetrating the stage ST (lower electrode LE) are formed at a position outside the electrostatic chuck ESC in a plan view. The lift pin 27a is inserted into each of these through holes 27. In FIG. 3, one through hole 27 into which one lift pin 27a is inserted is drawn. The lift pin 27a is provided to be vertically movable in the through hole 27. When the lift pin 27a rises, the focus ring FR supported on the second plate 18b rises.

In addition, a gas supply line 28 is provided in the plasma processing device 10. The gas supply line 28 supplies heat transfer gas from a heat transfer gas supply mechanism such as He gas to a place between the upper surface of the electrostatic chuck ESC and the back surface of the workpiece W.

In addition, the plasma processing device 10 includes an upper electrode 30. The upper electrode 30 is arranged above the stage ST and facing the stage ST. The upper electrode 30 is supported on the upper portion of the chamber 12 via an insulating shielding member 32. The upper electrode 30 can include a top plate 34 and a support 36. The top plate 34 faces the chamber S. The top plate 34 is provided with a plurality of gas discharge holes 34a. The top plate 34 can be formed of silicon or quartz. Alternatively, the top plate 34 may be configured by forming a plasma resistant film such as yttrium oxide on the surface of the aluminum base material.

The support 36 detachably supports the top plate 34. The support 36 may be formed of a conductive material such as aluminum. The support 36 can have a water-cooled structure. A gas diffusion chamber 36a is provided inside the support 36. A plurality of gas flow holes 36b communicating with the gas discharge hole 34a is extended downward from this gas diffusion chamber 36a. In addition, a gas introduction port 36c for guiding the processing gas into the gas diffusion chamber 36a is formed in the support 36. A gas supply pipe 38 is connected to the gas introduction port 36c.

A gas source group 40 is connected to the gas supply pipe 38 via a valve group 42 and a flow rate controller group 44. The gas source group 40 includes a plurality of gas sources for a plurality of types of gases. The valve group 42 includes a plurality of valves and the flow rate controller group 44 includes a plurality of flow rate controllers such as mass flow controllers. The plurality of gas sources of the gas source group 40 are connected to the gas supply pipe 38 via the corresponding valve of the valve group 42 and the corresponding flow rate controller of the flow rate controller group 44, respectively.

In addition, in the plasma processing device 10, a depot shield 46 is detachably provided along the inner wall of the chamber 12. The depot shield 46 is also provided on the outer circumference of the support portion 14. The depot shield 46 prevents etching by-products (depots) from adhering to the chamber 12. The depot shield 46 can be configured by coating an aluminum material with ceramics such as yttrium oxide.

An exhaust plate 48 is provided on the bottom portion side of the chamber 12, and between the support portion 14 and the side wall of the chamber 12. The exhaust plate 48 can be configured, for example, by coating an aluminum material with ceramics such as yttrium oxide. In the exhaust plate 48, a plurality of holes penetrating in the thickness direction are formed. An exhaust port 12e is provided below the exhaust plate 48 and on the chamber 12. An exhaust device 50 is connected to the exhaust port 12e via an exhaust pipe 52. The exhaust device 50 includes a vacuum pump such as a pressure regulating valve and a turbo molecular pump. The exhaust device 50 can reduce the pressure of the space in the chamber 12 to a desired degree of vacuum. In addition, the side wall of the chamber 12 is provided with a carry-inlet/outlet 12g for the workpiece W. The carry-inlet/outlet 12g can be opened and closed by a gate valve 54.

In addition, the plasma processing device 10 further includes a first high frequency power supply 62 and a second high frequency power supply 64. The first high frequency power supply 62 is a power supply that generates a first high frequency for the plasma generation. The first high frequency power supply 62 generates, for example, a high frequency having a frequency of 27 to 100 MHz. The first high frequency power supply 62 is connected to the upper electrode 30 via a matcher 66. The matcher 66 includes a circuit for matching an output impedance of the first high frequency power supply 62 with an input impedance of the load side (upper electrode 30 side). The first high frequency power supply 62 may be connected to the lower electrode LE via the matcher 66.

The second high frequency power supply 64 is a power supply that generates a second high frequency for drawing ions into the workpiece W. The second high frequency power supply 64 generates, for example, a high frequency with a frequency in the range of 400 kHz to 13.56 MHz. The second high frequency power supply 64 is connected to the lower electrode LE via a matcher 68. The matcher 68 includes a circuit for matching an output impedance of the second high frequency power supply 64 with an input impedance of the load side (lower electrode LE side).

In the plasma processing device 10, gas from one or more gas sources selected from the plurality of gas sources is supplied to the chamber S. In addition, the pressure in the chamber S is set to a predetermined pressure by the exhaust device 50. Further, the gas in the chamber S is excited by the first high frequency from the first high frequency power supply 62. As a result, the plasma is generated. Then, workpiece W is processed by the generated active species. If necessary, ions may be drawn into the workpiece W by a bias based on the second high frequency from the second high frequency power supply 64.

Figure 4:
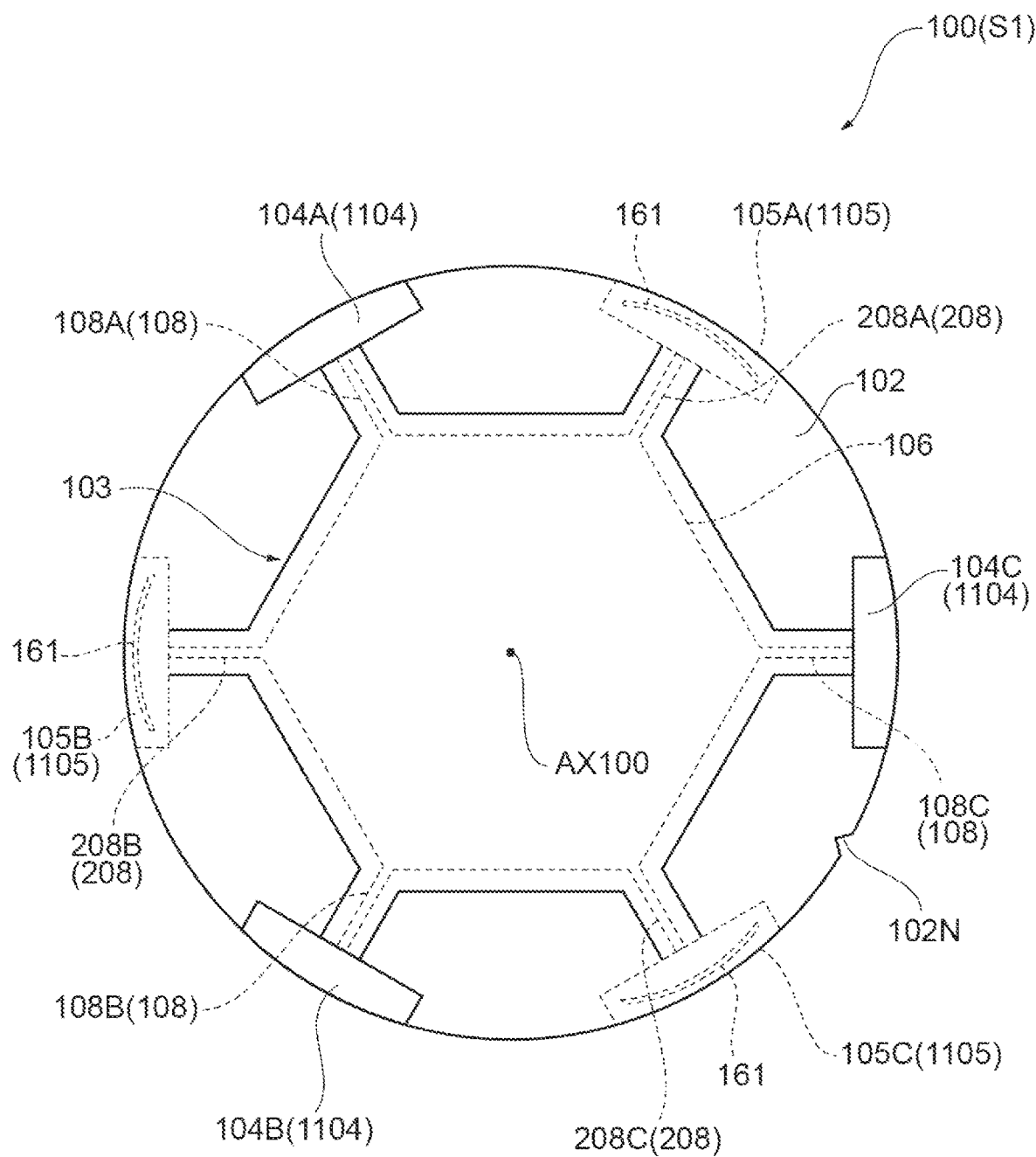
FIG. 4 is a plan view illustrating an example of a measuring instrument as viewed from the top surface side.
Figure 5:
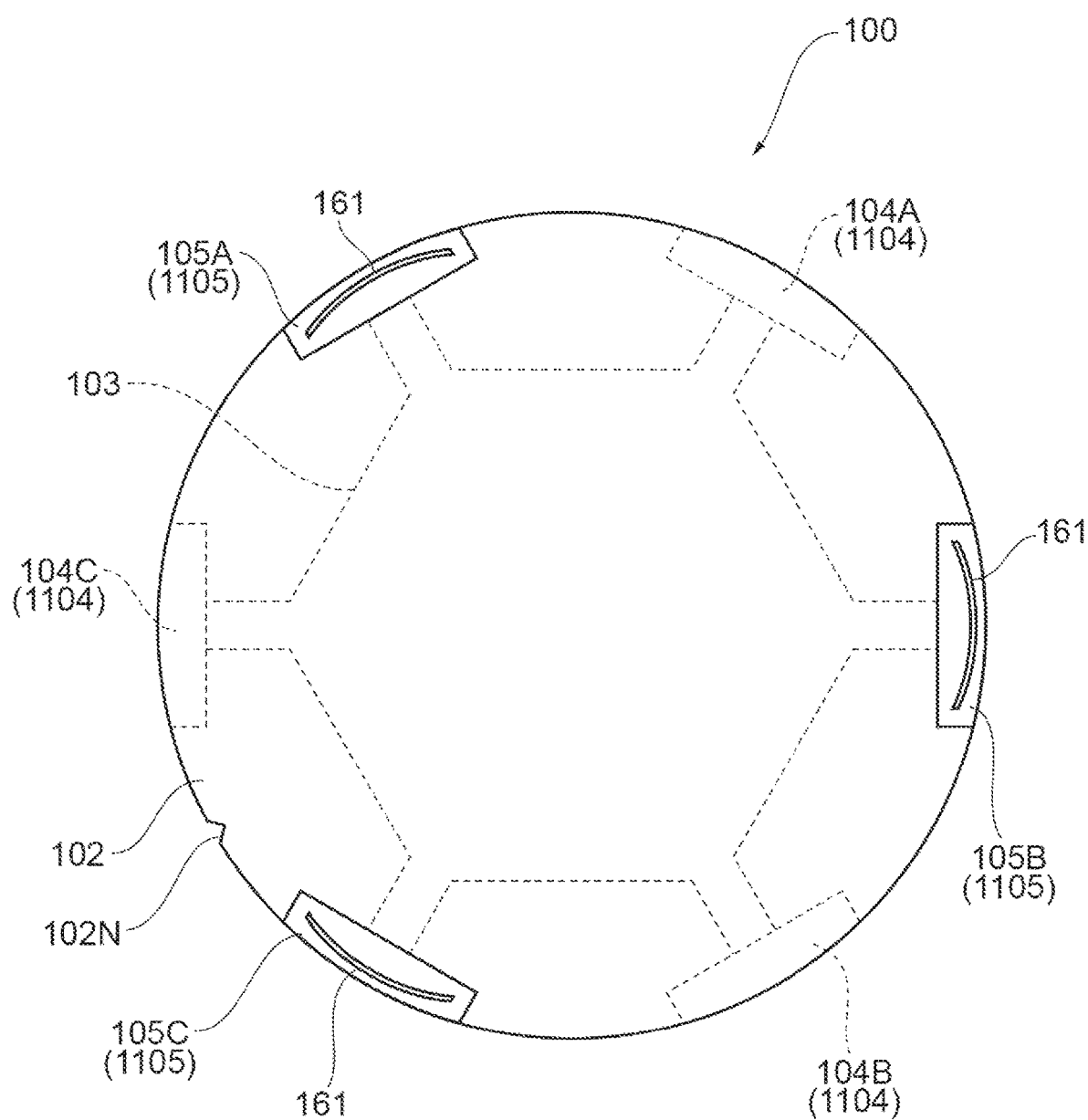
FIG. 5 is a plan view illustrating an example of a measuring instrument as viewed from a bottom surface side.

Next, the execution device will be described. FIG. 4 is a plan view illustrating an example of the execution device as viewed from the top surface side. FIG. 5 is a plan view illustrating the execution device as viewed from the bottom surface side. An execution device 100 as an example may be a measuring instrument for measuring the transport position by the transport device of the processing system 1. The execution device 100 in the illustrated example is transported by the transport device of the processing system 1 having a function as the semiconductor manufacturing apparatus S1, and executes the measurement of the electrostatic capacitance as the predetermined operation. Further, the execution device 100 measures the transport position based on the measured electrostatic capacitance.

The execution device 100 illustrated in FIG. 4 and FIG. 5 includes a base board 102. The base board 102 is formed of, for example, silicon, and has a shape similar to the shape of the workpiece W, that is, a substantially disk shape. A diameter of the base board 102 is the same as a diameter of the workpiece W, for example, 300 mm. The shape and dimensions of the execution device 100 are defined by the shape and dimensions of this base board 102. Therefore, the execution device 100 has a shape similar to the shape of the workpiece W and has the same dimensions as the workpiece W. In addition, a notch 102N (or another marker) is formed on an edge of the base board 102.

The base board 102 is provided with a first sensor 1104 as the operation device for executing the predetermined operation. The first sensor 1104 include a plurality of first sensing probes 104A to 104C for measuring the electrostatic capacitance, A/D converter 173, and a sensor output acquisition circuit 195. The plurality of first sensing probes 104A to 104C are arranged at equal intervals along the edge of the base board 102, for example, all around the edge. Specifically, each of the plurality of first sensing probes 104A to 104C is provided along the edge on the top surface side of the base board 102. The front end surfaces of each of the plurality of first sensing probes 104A to 104C are along the side surface of the base board 102.

In addition, the base board 102 is provided with a second sensor 1105 as the operation device for executing the predetermined operation. The second sensor 1105 include a plurality of second sensing probes 105A to 105C for measuring the electrostatic capacitance, A/D converter 173, and a sensor output acquisition circuit 195. The plurality of second sensing probes 105A to 105C are arranged at equal intervals along the edge of the base board 102, for example, all around the edge. Specifically, each of the plurality of second sensing probes 105A to 105C is provided along the edge on the bottom surface side of the base board. Each sensor electrode 161 of the plurality of second sensing probes 105A to 105C is along the bottom surface of the base board 102. In addition, the second sensing probes 105A to 105C and the first sensing probes 104A to 104C are alternately arranged at intervals of 60° in the circumferential direction. In the description hereinafter, sometimes the first sensing probes 104A to 104C and the second sensing probes 105A to 105C may be collectively referred to as an electrostatic capacitance sensor.

A circuit board 106 is provided in the center of the top surface of the base board 102. Wiring groups 108A to 108C are provided between the circuit board 106 and the plurality of first sensing probes 104A to 104C for electrically connecting each other. In addition, wiring groups 208A to 208C are provided between the circuit board 106 and the plurality of second sensing probes 105A to 105C for electrically connecting each other. The circuit board 106, the wiring groups 108A to 108C, and the wiring groups 208A to 208C are covered with a cover 103.

Figure 6:
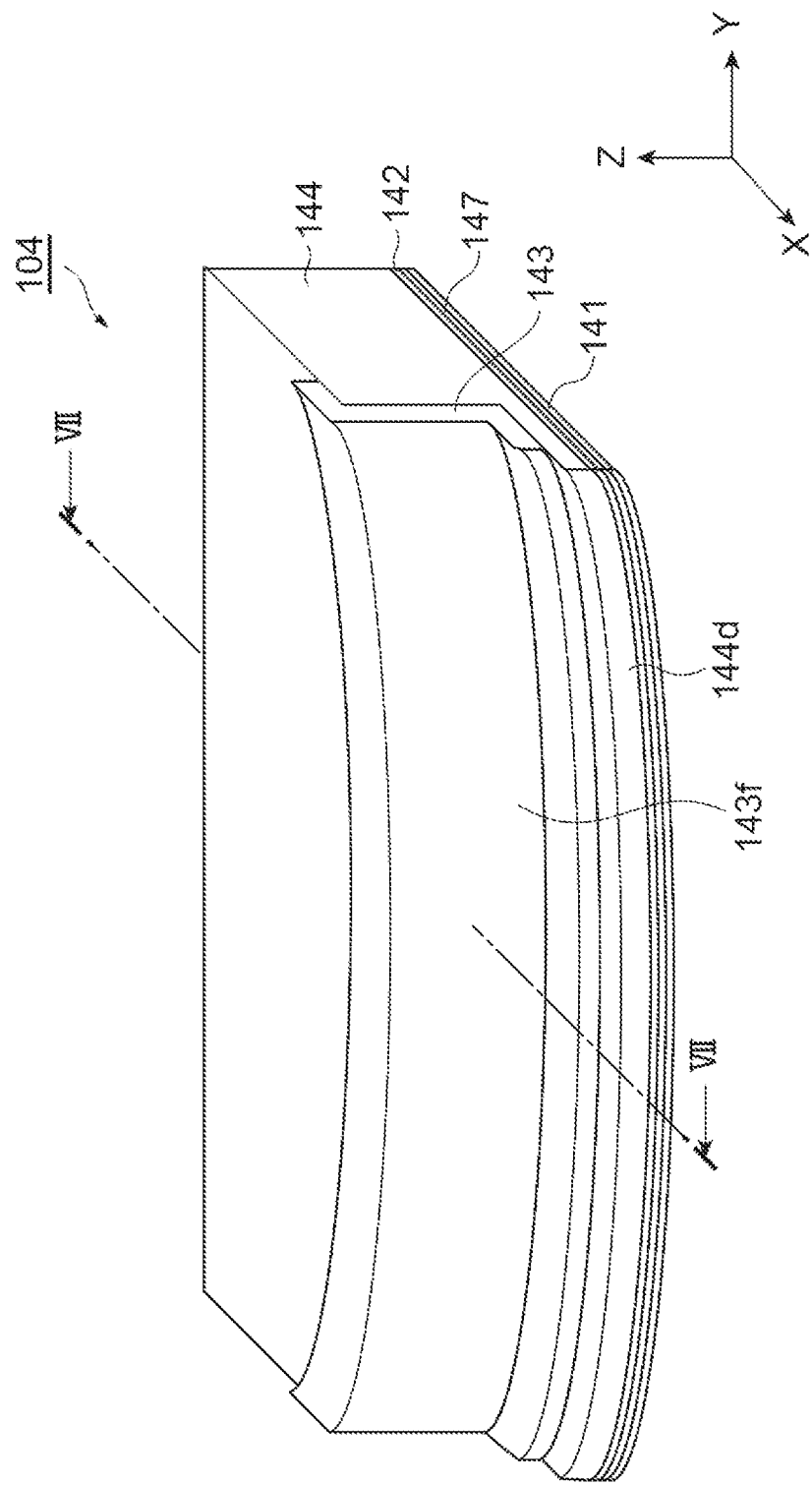
FIG. 6 is a perspective view illustrating an example of a first sensor.
Figure 7:
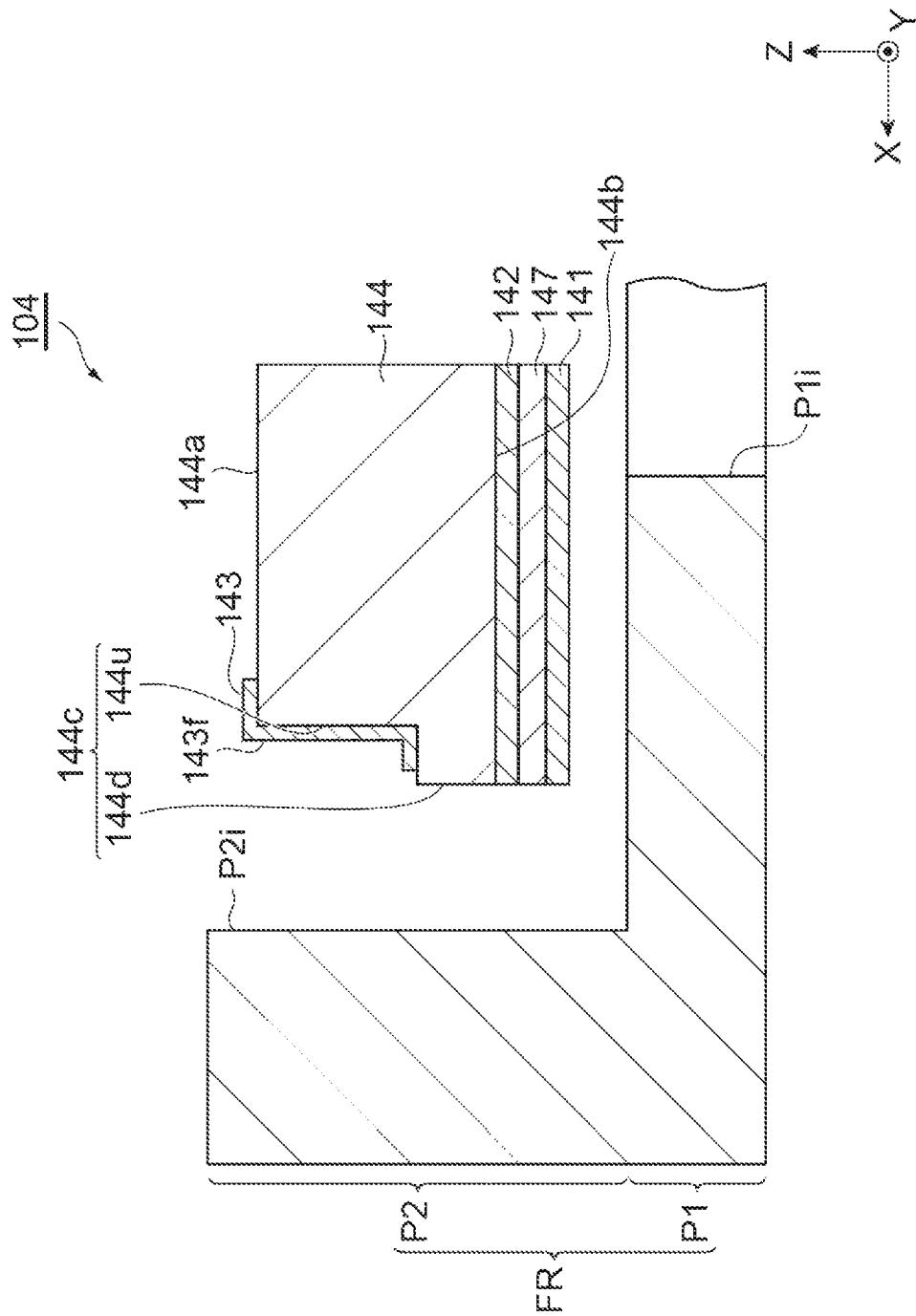
FIG. 7 is a cross-sectional view taken along the line VII-VII in FIG. 6.

Hereinafter, the first sensor will be described in detail. FIG. 6 is a perspective view illustrating an example of the sensor. FIG. 7 is a cross-sectional view taken along the line VII-VII in FIG. 6. The first sensing probe 104 illustrated in FIG. 6 and FIG. 7 is a sensor used as a plurality of first sensing probes 104A to 104C of the execution device 100, and is configured as a chip-shaped component. In the description below, the XYZ rectangular coordinate system will be referred to as appropriate. The X-direction indicates a front direction of the first sensing probe 104, the Y-direction indicates a direction orthogonal to the X direction and indicates the width direction of the first sensing probe 104, and the Z direction indicates a direction orthogonal to the X-direction and the Y-direction, and indicates an upward direction of the first sensing probe 104. FIG. 7 illustrates the focus ring FR together with the first sensing probe 104.

The first sensing probe 104 includes an electrode 141, a guard electrode 142, a sensor electrode 143, a board portion 144, and an insulating region 147.

The board portion 144 is formed of, for example, borosilicate glass or quartz. The board portion 144 has a top surface 144a, a bottom surface 144b, and a front end surface 144c. The guard electrode 142 is provided below the bottom surface 144b of the board portion 144 and extends in the X and Y directions. In addition, the electrode 141 is provided below the guard electrode 142 via the insulating region 147, and extends in the X direction and the Y direction. The insulating region 147 is formed of, for example, $SiO_2$, SiN, $Al_2O_3$, or polyimide.

The front end surface 144c of the board portion 144 is formed in a step shape. A lower side surface 144d of the front end surface 144c protrudes toward the focus ring FR side from an upper side surface 144u of the front end surface 144c. The sensor electrode 143 extends along the upper side surface 144u of the front end surface 144c. In an exemplary embodiment, the upper side surface 144u and the lower side surface 144d of the front end surface 144c are curved surfaces having a predetermined curvature, respectively. That is, the upper side surface 144u of the front end surface 144c has a constant curvature at any position of the upper side surface 144u, and the curvature of the upper side surface 144u is a reciprocal number of a distance between the central axis AX100 of the execution device 100 and the upper side surface and 144u of the front end surface 144c. In addition, the lower side surface 144d of the front end surface 144c has a constant curvature at any position of the lower side surface 144d, and the curvature of the lower side surface 144d is a reciprocal number of a distance between the central axis AX100 of the execution device 100 and the lower side surface 144d of the front end surface 144c.

The sensor electrode 143 is provided along the upper side surface 144u of the front end surface 144c. In an exemplary embodiment, a front surface 143f of the sensor electrode 143 is also a curved surface. That is, the front surface 143f of the sensor electrode 143 has a constant curvature at any position of the front surface 143f, and the curvature is a reciprocal number of a distance between the central axis AX100 of the execution device 100 and the front surface 143f.

When the first sensing probe 104 is used as the sensor of the execution device 100, as described later, the electrode 141 is connected to a wiring 181, the guard electrode 142 is connected to a wiring 182, and the sensor electrode 143 is connected to a wiring 183.

In the first sensing probe 104, the sensor electrode 143 is shielded from below of the first sensing probe 104 by the electrode 141 and the guard electrode 142. Therefore, according to the first sensing probe 104, it is possible to measure the electrostatic capacitance with high directivity in a specific direction, that is, in the direction (X direction) in which the front surface 143f of the sensor electrode 143 is facing.

Figure 8:
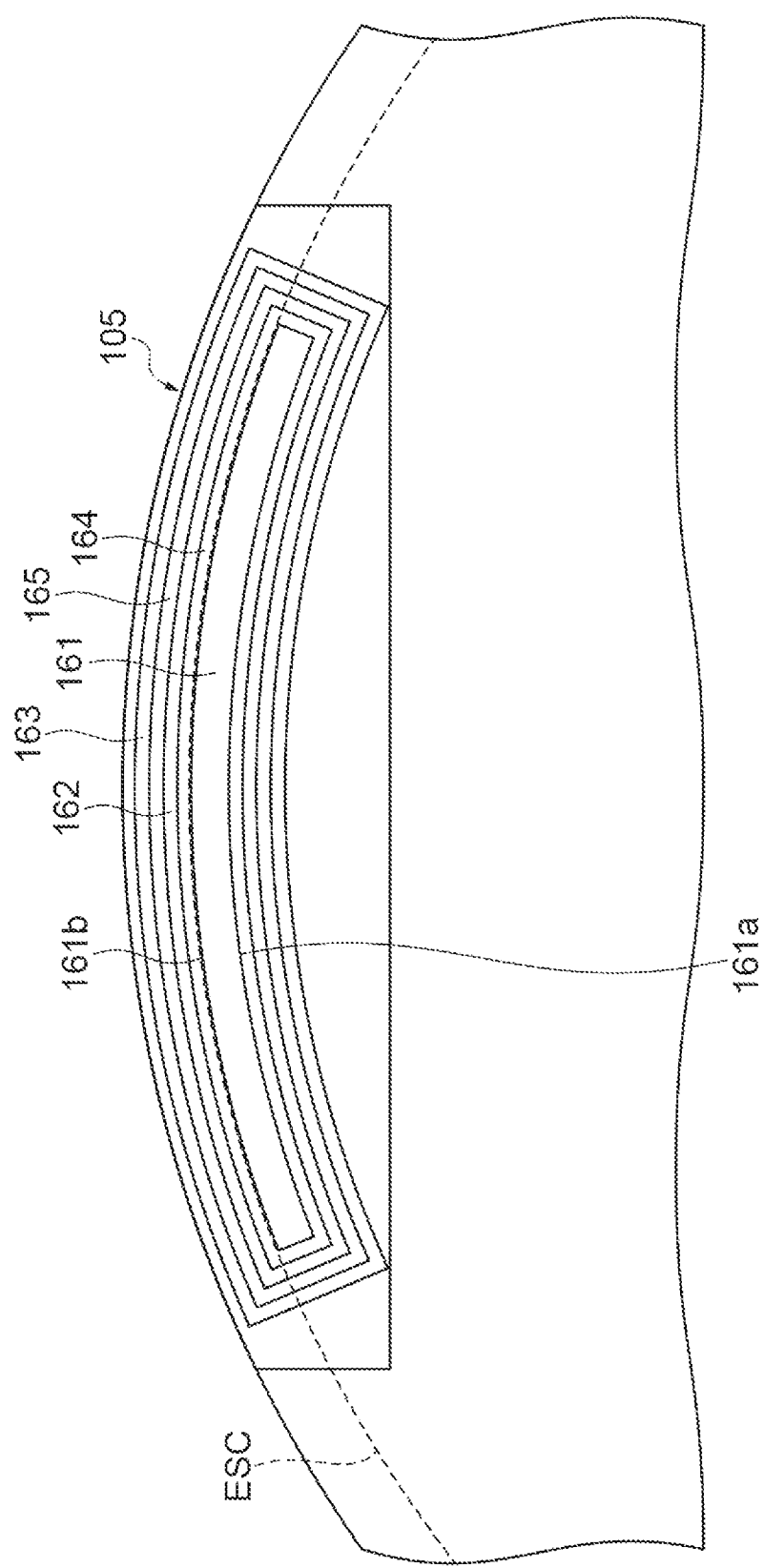
FIG. 8 is an enlarged view of the second sensor 5 FIG. 5.

Hereinafter, the second sensor will be described in detail. FIG. 8 is a partially enlarged view of FIG. 5, illustrating one second sensor. The second sensing probe 105 includes a sensor electrode 161. An edge of the sensor electrode 161 has partially an arc shape. That is, the sensor electrode 161 has a planar shape defined by an inner edge 161a and an outer edge 161b, which are two arcs having different radii with the central axis AX100 as a center. The outer edge 161b at the outside in the radial direction of each sensor electrode 161 of the plurality of second sensing probes 105A to 105C extends on a common circle. In addition, the inner edge 161a at the inner side in the radial direction of each sensors electrode 161 of the plurality of second sensing probes 105A to 105C extends on another common circle. The curvature of a part of the edge of the sensor electrode 161 coincides with the curvature of the edge of the electrostatic chuck ESC. In an exemplary embodiment, the curvature of the outer edge 161b forming the edge at the outside in the radial direction of the sensor electrode 161 coincides with the curvature of the edge of the electrostatic chuck ESC. The center of curvature of the outer edge 161b, that is, the center of the circle on which the outer edge 161b extends, shares the central axis AX100.

In an exemplary embodiment, the second sensing probe 105 further includes a guard electrode 162 that surrounds the sensor electrode 161. The guard electrode 162 has a frame shape and surrounds the sensor electrode 161 over the entire circumference. The guard electrode 162 and the sensor electrode 161 are separated from each other so that an insulating region 164 is interposed therebetween. In addition, in an exemplary embodiment, the second sensing probe 105 further includes an electrode 163 that surrounds the guard electrode 162 at the outside of the guard electrode 162. The electrode 163 has a frame shape and surrounds the guard electrode 162 over the entire circumference. The guard electrode 162 and the electrode 163 are separated from each other so that an insulating region 165 is interposed therebetween.

Figure 9:
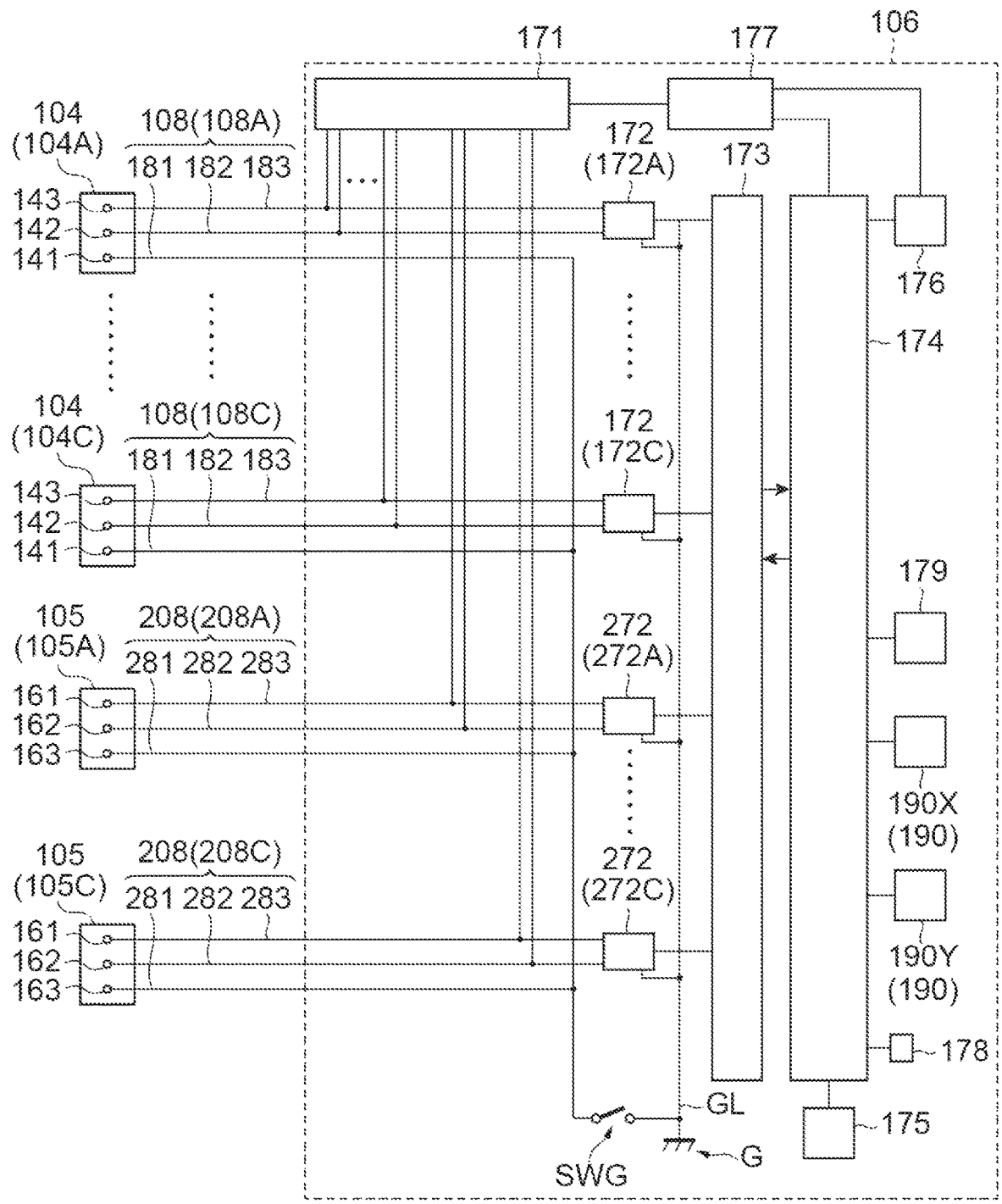
FIG. 9 is a diagram illustrating a configuration of a circuit board of the measuring instrument.

Hereinafter, the configuration of the circuit board 106 will be described. FIG. 9 is a diagram illustrating a configuration of a circuit board of the measuring instrument. The circuit board 106 includes a high frequency oscillator 171, a plurality of C/V conversion circuits 172A to 172C, a plurality of C/V conversion circuits 272A to 272C, A/D converter 173, a processor 174, a storage device 175, a communication device 176, and a power supply 177. In an example, the arithmetic device is configured with the processor 174. In addition, the circuit board 106 includes a temperature sensor 179. The temperature sensor 179 outputs a signal corresponding to the measured temperature to the processor 174. For example, the temperature sensor 179 can acquire the temperature of the environment around the execution device 100.

Each of the plurality of first sensing probes 104A to 104C is connected to the circuit board 106 via the corresponding wiring group among the plurality of wiring groups 108A to 108C. In addition, each of the plurality of first sensing probes 104A to 104C is connected to the corresponding C/V conversion circuit among the plurality of C/V conversion circuits 172A to 172C via a couple of wirings included in the corresponding wiring group. Each of the plurality of second sensing probes 105A to 105C is connected to the circuit board 106 via the corresponding wiring group among the plurality of wiring groups 208A to 208C. In addition, each of the plurality of second sensing probes 105A to 105C is connected to the corresponding C/V conversion circuit among the plurality of C/V conversion circuits 272A to 272C via a couple of wirings included in the corresponding wiring group. Hereinafter, one first sensing probe 104 having the same configuration as each of the first sensing probes 104A to 104C, one wiring group 108 having the same configuration as each of the wiring groups 108A to 108C, and one C/V conversion circuit 172 having the same configuration as each of the C/V conversion circuits 172A to 172C, will be described. In addition, one second sensing probe 105 having the same configuration as each of the second sensing probes 105A to 105C, one wiring group 208 having the same configuration as each of the wiring groups 208A to 208C, and one C/V conversion circuit 272 having the same configuration as each of C/V conversion circuits 272A to 272C, will be described.

The wiring group 108 includes wirings 181 to 183. One end of the wiring 181 is connected to the electrode 141. The wiring 181 is connected to a ground potential line GL connected to a ground G of the circuit board 106. The wiring 181 may be connected to the ground potential line GL via a switch SWG. In addition, one end of the wiring 182 is connected to the guard electrode 142, and the other end of the wiring 182 is connected to the C/V conversion circuit 172. In addition, one end of the wiring 183 is connected to the sensor electrode 143, and the other end of the wiring 183 is connected to the C/V conversion circuit 172.

The wiring group 208 includes wirings 281 to 283. One end of the wiring 281 is connected to the electrode 163. The wiring 281 is connected to a ground potential line GL connected to the ground G of the circuit board 106. The wiring 281 may be connected to the ground potential line GL via the switch SWG. In addition, one end of the wiring 282 is connected to the guard electrode 162, and the other end of the wiring 282 is connected to the C/V conversion circuit 272. In addition, one end of the wiring 283 is connected to the sensor electrode 161 and the other end of the wiring 283 is connected to the C/V conversion circuit 272.

The high frequency oscillator 171 is connected to a power supply 177 such as a battery, and is configured to receive power from the power supply 177 to generate a high frequency signal. The power supply 177 is also connected to the processor 174, the storage device 175, and the communication device 176. The high frequency oscillator 171 includes a plurality of output lines. The high frequency oscillator 171 gives the generated high frequency signal to the wiring 182 and the wiring 183, and to the wiring 282 and the wiring 283 via a plurality of output lines. Therefore, the high frequency oscillator 171 is electrically connected to the guard electrode 142 and the sensor electrode 143 of the first sensing probe 104, and the high frequency signal from the high frequency oscillator 171 is given to the guard electrode 142 and the sensor electrode 143. In addition, the high frequency oscillator 171 is electrically connected to the sensor electrode 161 and the guard electrode 162 of the second sensing probe 105, and the high frequency signal from the high frequency oscillator 171 is given to the sensor electrode 161 and the guard electrode 162.

The wiring 182 connected to the guard electrode 142 and the wiring 183 connected to the sensor electrode 143 are connected to the input of the C/V conversion circuit 172. That is, the guard electrode 142 and the sensor electrode 143 of the first sensing probe 104 are connected to the input of the C/V conversion circuit 172. In addition, the sensor electrode 161 and the guard electrode 162 are connected to the input of the C/V conversion circuit 272, respectively. The C/V conversion circuit 172 and the C/V conversion circuit 272 are configured to generate a voltage signal having an amplitude corresponding to the potential difference at the input, and output the voltage signal. The C/V conversion circuit 172 generates a voltage signal corresponding to the electrostatic capacitance formed by the corresponding first sensing probe 104. That is, as the electrostatic capacitance of the sensor electrode connected to the C/V conversion circuit 172 increases, the magnitude of the voltage of the voltage signal output from the C/V conversion circuit 172 increases. Similarly, as the electrostatic capacitance of the sensor electrode connected to the C/V conversion circuit 272 increases, the magnitude of the voltage of the voltage signal output from the C/V conversion circuit 272 increases.

The outputs of the C/V conversion circuit 172 and the C/V conversion circuit 272 are connected to the input of the A/D converter 173. In addition, the A/D converter 173 is connected to the processor 174. The A/D converter 173 is controlled by the control signal from the processor 174, converts the output signal (voltage signal) of the C/V conversion circuit 172 and the output signal (voltage signal) of the C/V conversion circuit 272 into digital values, and outputs the results to the processor 174 as detection values.

The storage device 175 is connected to the processor 174. The storage device 175 is a storage device such as a volatile memory, and is configured to store measurement data, for example. In addition, another storage device 178 is connected to the processor 174. The storage device 178 is a storage device such as a non-volatile memory, and stores, for example, a program read and executed by the processor 174.

The communication device 176 is a communication device compliant with any wireless communication standard. For example, the communication device 176 is compliant with Bluetooth®. The communication device 176 is configured to wirelessly transmit the measurement data stored in the storage device 175.

The processor 174 is configured to control each part of the execution device 100 by executing the program described above. For example, the processor 174 controls the supply of the high frequency signals from the high frequency oscillator 171 to the guard electrode 142, the sensor electrode 143, the sensor electrode 161, and the guard electrode 162. In addition, the processor 174 controls the supply of the power from the power supply 177 to the storage device 175, the supply of the power from the power supply 177 to the communication device 176, and the like. Furthermore, the processor 174 acquires the measurement value of the first sensing probe 104 and the measurement value of the second sensing probe 105 based on the detection value input from the A/D converter 173 by executing the program described above. In an embodiment, when the detection value output from the A/D converter 173 is X, in the processor 174, the measurement value is acquired based on the detection value such that the measurement value becomes proportional to (aX+b). Here, a and b are constants that change depending on the state of the circuit, and the like. The processor 174 may have, for example, a predetermined arithmetic expression (function) such that the measurement value becomes a value proportional to (aX+b).

In the execution device 100 described above, in a state where the execution device 100 is arranged in a region surrounded by the focus ring FR, a plurality of sensor electrodes 143 and the guard electrodes 142 face the inner edge of the focus ring FR. The measurement value generated based on the potential difference between the signal of the sensor electrode 143 and the signal of the guard electrode 142 represents the electrostatic capacitance that reflects the distance between each of the plurality of sensor electrodes 143 and the focus ring FR. The electrostatic capacitance C is represented by C=εS/d. ε is the permittivity of the medium between the front surface 143f of the sensor electrode 143 and the inner edge of the focus ring FR, S is the area of the front surface 143f of the sensor electrode 143, and d can be regarded as a distance between the front surface 143f of the sensor electrode 143 and the inner edge of the focus ring FR.

Therefore, according to the execution device 100, the measurement data that reflects the relative positional relationship between the execution device 100 imitating the workpiece W and the focus ring FR can be obtained. For example, the plurality of measurement values acquired by the execution device 100 become smaller as the distance between the front surface 143f of the sensor electrode 143 and the inner edge of the focus ring FR becomes larger. Therefore, an amount of deviation of each sensor electrode 143 in each radial direction of the focus ring FR can be obtained based on the measurement value representing the electrostatic capacitance of each sensor electrode 143 of the first sensing probes 104A to 104C. Then, the transport position of the execution device 100 can be obtained from the amount of deviation of each sensor electrode 143 of the first sensing probes 104A to 104C in each radial direction.

In addition, in a state in which the execution device 100 is mounted on the electrostatic chuck ESC, a plurality of sensor electrodes 161 and the guard electrodes 162 face the electrostatic chuck ESC. As described above, the electrostatic capacitance C is represented by C=εS/d. ε is the permittivity of the medium between the sensor electrode 161 and the electrode of the electrostatic chuck ESC. d is a distance between the sensor electrode 161 and the electrode of the electrostatic chuck ESC. S can be regarded as an area where the sensor electrode 161 and the electrode of the electrostatic chuck ESC overlap each other in a plan view. The area S changes depending on a relative positional relationship between the execution device 100 and the electrode of the electrostatic chuck ESC. Therefore, according to the execution device 100, the measurement data that reflects the relative positional relationship between the execution device 100 imitating the workpiece W and the electrostatic chuck ESC can be obtained.

In an example, when the execution device 100 is transported to a predetermined transport position, that is, a position on the electrostatic chuck ESC where the center of the electrostatic chuck ESC coincides with the center of the execution device 100, the outer edge 161b of the sensor electrode 161 and the edge of the electrostatic chuck ESC may coincide with each other. In this case, for example, since the transport position of the execution device 100 is deviated from the predetermined transport position, when the sensor electrode 161 is deviated outward in the radial direction with respect to the electrostatic chuck ESC, the area S decreases. That is, the electrostatic capacitance measured by the sensor electrode 161 becomes smaller than the electrostatic capacitance when the execution device 100 is transported to the predetermined transport position. There- fore, the amount of deviation of each sensor electrode 161 of the electrostatic chuck ESC in each radial direction can be obtained based on the measurement value representing the electrostatic capacitance of each sensor electrode 161 of the second sensing probes 105A to 105C. Then, the transport position of the execution device 100 can be obtained from the amount of deviation of each sensor electrode 161 of the second sensing probes 105A to 105C in each radial direction.

In addition, the circuit board 106 includes an acceleration sensor 190. The acceleration sensor 190 detects the transport operation of the execution device 100 in the processing system 1 by detecting the acceleration applied to the execution device 100. An example of the acceleration sensor 190 is configured to include at least a first acceleration sensor 190X and a second acceleration sensor 190Y.

Figure 10:
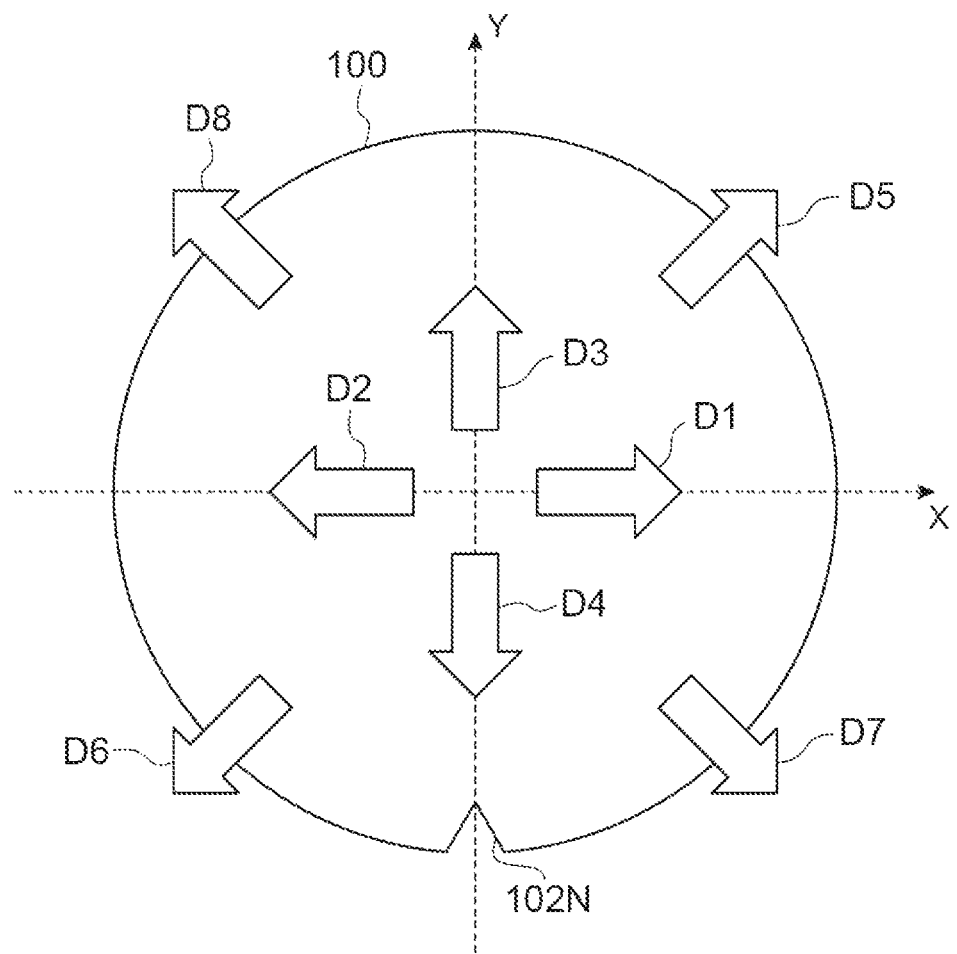
FIG. 10 is a schematic diagram for explaining an acceleration sensor of the execution device as an example.

FIG. 10 is a schematic diagram for explaining the acceleration sensor 190 provided on the execution device 100. In FIG. 10, a schematic plan view of the execution device 100 viewed from above is illustrated. The Y-axis in FIG. 10 passes through the center of the execution device 100 and the notch 110N. The X-axis is orthogonal to the Y-axis and passes through the center of the execution device 100. The X-axis and the Y-axis may be axes that are orthogonal (intersect) to each other along a plane along the base board.

The first acceleration sensor 190X is configured to detect the acceleration in the X-axis direction, and the second acceleration sensor 190Y is configured to detect the acceleration in the Y-axis direction. Therefore, when the execution device 100 is in a horizontal state, the acceleration in a first direction along the horizontal direction can be detected by the first acceleration sensor 190X. In addition, the acceleration in a second direction intersecting the first direction along the horizontal direction can be detected by the second acceleration sensor 190Y.

In one example, when the acceleration applied in the positive direction of the X-axis is detected, the first acceleration sensor 190X outputs a positive detection value according to the magnitude of acceleration, and when the acceleration applied in the negative direction of the X-axis is detected, outputs a negative detection value according to the magnitude of acceleration. In addition, when the acceleration applied in the positive direction of the Y-axis is detected, the second acceleration sensor 190Y outputs a positive detection value according to the magnitude of the acceleration, and when the acceleration applied in the negative direction of the Y-axis is detected, outputs a negative detection value according to the magnitude of acceleration.

In an example of the execution device 100, each of the detection values from the first acceleration sensor 190X and the second acceleration sensor 190Y is input to the processor 174. The processor 174 sums (compose) the detection value of the first acceleration sensor 190X and the detection value of the second acceleration sensor 190Y, and derives a total value (composite value). The processor 174 can determine whether the execution device 100 is being transported by the transport device based on the total value.

When the execution device 100 is transported in the directions D1 and D2 along the X-axis illustrated in FIG. 10, the acceleration is substantially not detected by the second acceleration sensor 190Y. Therefore, the processor 174 may set the detection value by only the first acceleration sensor 190X as the total value. Similarly, when the execution device 100 is transported in the directions D3 and D4 along the Y-axis illustrated in FIG. 10, the processor 174 may set the detection value by only the second acceleration sensor 190Y as the total value. In addition, when the execution device is transported in the direction D5 which is the positive direction along both the X-axis and the Y-axis and the execution device is transported in the direction D6 which is the negative direction along both the X-axis and the Y-axis, the value obtained by adding the detection values may be used as the total value.

When the execution device 100 is transported in the direction D7 where the X-axis is the positive direction and the Y-axis is the negative direction, and in the direction D8 where the X-axis is the negative direction and the Y-axis is the positive direction, the sign of the detection value by the first acceleration sensor 190X and the sign of the detection value by the second acceleration sensor 190Y are opposite to each other. Therefore, the value obtained by subtracting the detection value by the second acceleration sensor 190Y from the detection value by the first acceleration sensor 190X may be used as the total value. Since there is no problem as long as the detection value by the first acceleration sensor 190X and the detection value by the second acceleration sensor 190Y are not canceled by the summation, the value obtained by subtracting the detection value of the first acceleration sensor 190X from the detection value of the second acceleration sensor 190Y may be used as the total value.

As an example, when one of the two detection values input to the processor 174 is substantially zero, the processor 174 may determine that the execution device 100 is transported in the directions D1, D2, D3, and D4 to calculate the total value. In addition, when the signs of the two detection values input to the processor 174 are the same, the processor 174 may determine that the execution device 100 is transported in the directions D5 and D6 to calculate the total value. In addition, when the signs of the two detection values input to the processor 174 are different from each other, the processor 174 may determine that the execution device 100 is transported in the directions D7 and D8 to calculate the total value.

Figure 11:
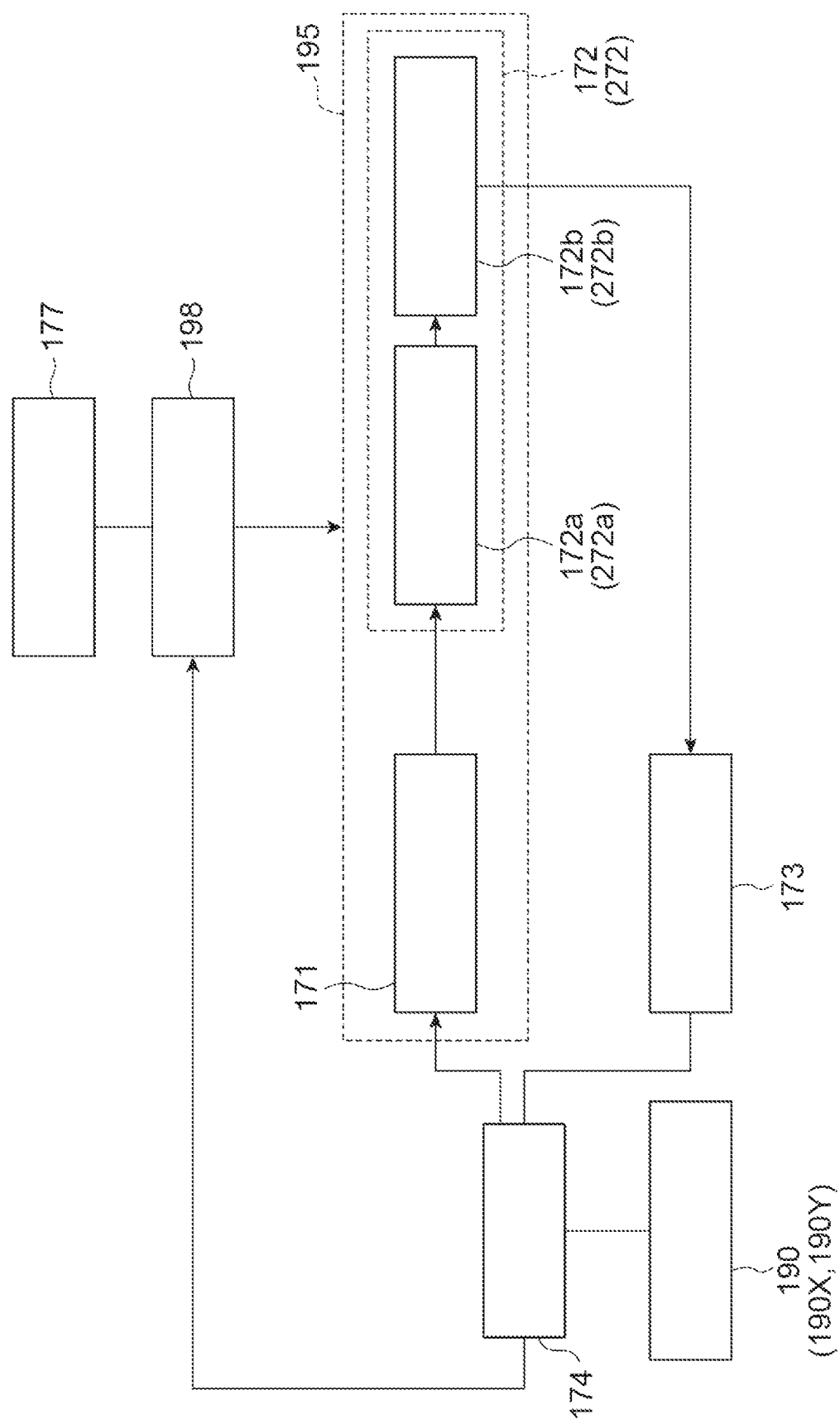
FIG. 11 is a block diagram illustrating an example of a circuit of a power supply control system.

Subsequently, the operation control in the execution device 100 will be described. FIG. 11 is a block diagram illustrating a circuit of a power supply control system. In an example of the execution device 100, the supply of the power from the power supply 177 to a sensor output acquisition circuit (operation device) 195 is controlled based on the acceleration measured by the acceleration sensor 190. The sensor output acquisition circuit 195 is a circuit for acquiring an output signal from the electrostatic capacitance sensor, and includes the high frequency oscillator 171 and the C/V conversion circuits 172 and 272 described above. The C/V conversion circuits 172 and 272 include amplifier circuits 172a and 272a and filter circuits 172b and 272b. The amplifier circuits 172a and 272a amplify a potential difference between the signals from the sensor electrodes 143 and 161 input to the C/V conversion circuits 172 and 272 and the signals from the guard electrodes 142 and 162. In addition the filter circuits 172b and 272b reduce the noise of the voltage signal output from the amplifier circuits 172a and 272a. In an example, any of the amplifier circuits 172a and 272a and the filter circuits 172b and 272b include an operational amplifier, and are operated by the electric power supplied from the power supply 177.

The power supply 177 and the sensor output acquisition circuit 195 are electrically connected to each other via a switch 198. The switch 198 has a function of switching a path between the power supply 177 and the sensor output acquisition circuit 195 to and from an electrically connected state and an electrically disconnected state. When the switch 198 is in a connected state, the power is supplied from the power supply 177 to the sensor output acquisition circuit 195. That is, when the switch 198 is in the connected state, the first sensing probes 104A to 104C and the second sensing probes 105A to 105C are operated, and the electrostatic capacitance can be acquired. In addition, when the switch 198 is in a disconnected state, the supply of the power to the sensor output acquisition circuit 195 from the power supply 177 is stopped. The switch 198 may be an electronic switch such as a transistor.

The connection and disconnection of the switch 198 is controlled by the processor 174. As described above, the execution device 100 in an example performs the measurement of the electrostatic capacitance in the state of being mounted on the electrostatic chuck ESC, and executes the measurement of the transport position. Therefore, the processor 174 controls the switch 198 from the disconnected state to the connected state after the execution device 100 is mounted on the electrostatic chuck ESC.

An example of the processor 174 measures the elapsed time after the acceleration measured by the acceleration sensor 190 becomes a value within the predetermined reference range. For example, the processor 174 may measure the elapsed time using a built-in timer. The reference range of the acceleration is a range in which the value of acceleration added to the execution device 100 in the transport by the transport device TU1 and TU2 is not included. That is, when the acceleration exceeding the reference range is detected, it can be considered that the execution device 100 is transported by the transport devices TU1 and TU2. For example, the reference range can be defined as a range from a positive threshold value to a negative threshold value. As an example, the acceleration reference range may be a range from $-0.005$ m/s$^2$ to $0.005$ m/s$^2$.

When the predetermined time elapses without the acceleration exceeding the positive or negative threshold value, the processor 174 determines that the execution device 100 is mounted on the stage ST (electrostatic chuck ESC) of the processing system 1 and controls the wiring between the power supply 177 and the sensor output acquisition circuit 195 to be in the electrically connected state. That is, the processor 174 causes the execution device 100 to execute the acquisition of the electrostatic capacitance (predetermined operation). For example, when the measured acceleration remains in the reference range for 60 seconds or more, the processor 174 may controlled such that the switch 198 is connected.

Figure 12:
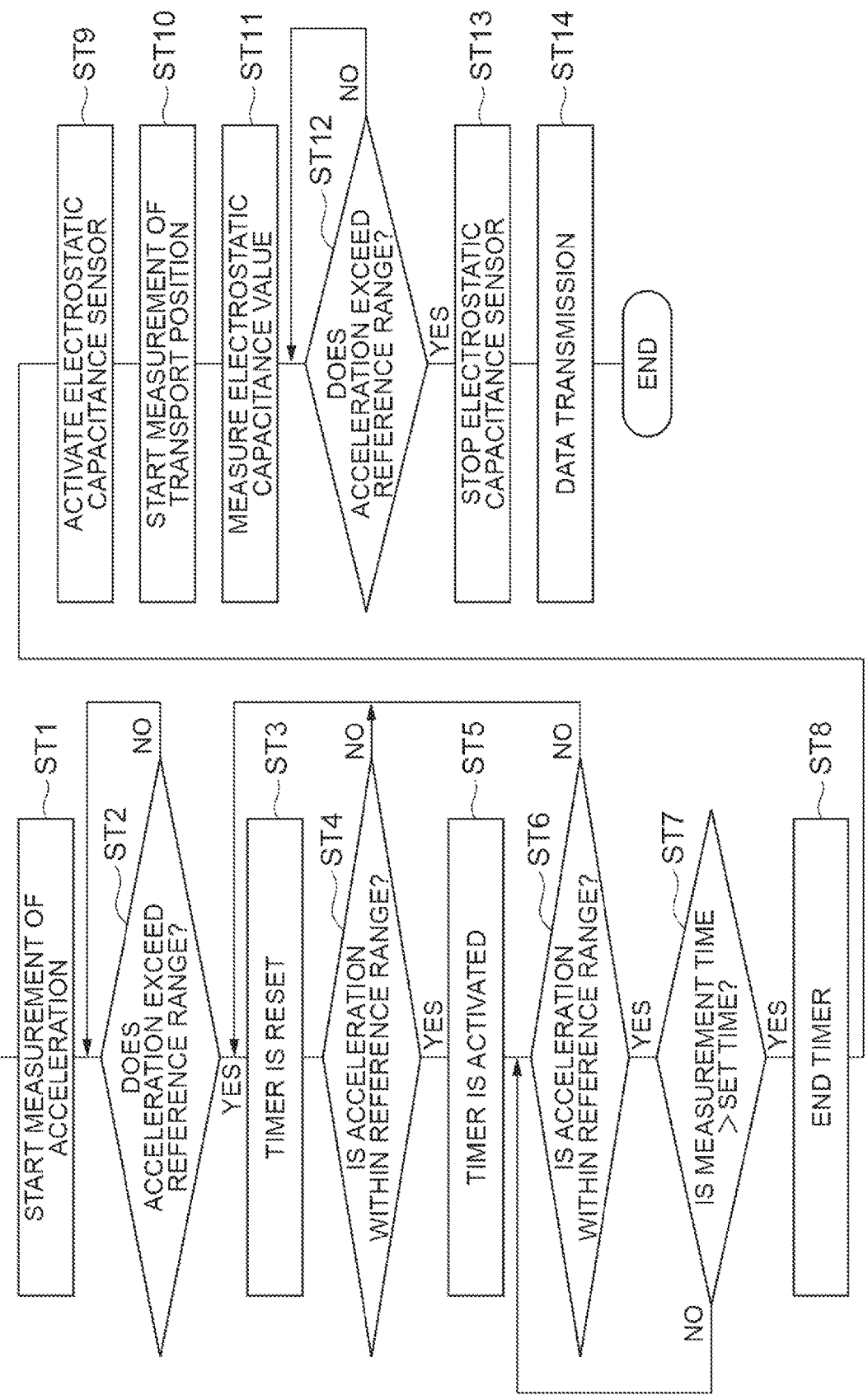
FIG. 12 is a flowchart illustrating an example of an operation method of the execution device.

FIG. 12 is a flowchart illustrating an example of the operation of the execution device. In the example in FIG. 12, the execution device 100 is transported to the electrostatic chuck ESC (stage ST) by the processing system 1, and the operation of acquiring the position information based on the electrostatic capacitance acquired in the electrostatic chuck ESC, is illustrated. For example, the transport device of the processing system 1 is controlled so as to mount the execution device 100 accommodated in the dedicated FOUP, which is one of the containers 4a to 4d, on the electrostatic chuck ESC, and to return the execution device 100 mounted on the electrostatic chuck ESC into the FOUP after a certain period of time elapses.

In the example in FIG. 12, first, the measurement of acceleration is started by the execution device 100 (STEP ST1). For example, the execution device 100 may be activated in a state of being accommodated in the dedicated FOUP connected to the processing system 1. When the execution device 100 is activated, by the acceleration sensor 190 being operated, the signal from the acceleration sensor 190 is acquired by the processor 174. Even if the execution device 100 is activated, the switch 198 is in the disconnected state in the initial state. That is, the supply of the power from the power supply 177 to the sensor output acquisition circuit 195 is stopped. In STEP ST1, the controller MC controls the processing system 1 such that the transport devices TU1 and TU2 transport the execution device 100 from the FOUP to the electrostatic chuck ESC in the process module PM.

Subsequently, it is determined whether the acceleration measured by the acceleration sensor 190 exceeds the reference range (STEP ST2). When the execution device 100 is mounted in FOUP, the acceleration detected by the acceleration sensor 190 of the execution device 100 is within the reference range. On the other hand, when the transport of the execution device 100 is started, the acceleration sensor 190 measures the acceleration exceeding the reference range. In STEP ST2, when the measurement value by the acceleration sensor 190 is within the reference range, the transport by the transport device is determined not to be started, and STEP ST2 is repeated.

In STEP ST2, when the acceleration measured by the acceleration sensor 190 is determined to exceed the reference range, a timer of the processor 174 is reset, and the state becomes a standby state for measuring the elapsed time after the acceleration is within the reference range (STEP ST3).

Subsequently, it is determined whether the acceleration measured by the acceleration sensor 190 is within the reference range (STEP ST4). When the execution device 100 is in a state of being transported, the acceleration exceeds the reference range. Therefore, STEP ST4 is repeated while the execution device 100 is being transported. On the other hand, when the transport is finished and the execution device 100 is mounted on the electrostatic chuck ESC, the acceleration by the transport is not applied to the execution device 100. That is, in STEP ST4, the measurement value by the acceleration sensor 190 is determined to be within the reference range.

When the acceleration is within the reference range, the timer of the processor 174 is activated and the elapsed time after the acceleration is within the reference range is measured (STEP ST5). Depending on the situation of the transport, it is conceivable that the acceleration applied to the execution device 100 is within the reference range because the execution device 100 is temporarily stopped during the transport of the execution device 100. In this case, since the execution device 100 is actually in transport, it is necessary to avoid the determination that the execution device 100 is mounted on the electrostatic chuck ESC. Therefore, during the measurement of the elapsed time, whether the acceleration is within the reference range is repeatedly determined (STEP ST6). As a result, when the acceleration exceeds the reference range, the process returns to STEP ST3 and the timer is reset. That is, the measurement of the elapsed time by the timer is stopped, and the timer is returned to the initial state.

When the acceleration is determined to be within the reference range in STEP ST6, it is determined whether the elapsed time after the acceleration is within the reference range exceeds the set time (STEP ST7). When the elapsed time does not exceed the set time, the process returns to STEP ST6. When the elapsed time exceeds the set time, the processor 174 ends the timer (STEP ST8) and activates the electrostatic capacitance sensor (STEP ST9). That is, the processor 174 supplies the power from the power supply 177 to the sensor output acquisition circuit 195 with the switch 198 be in the connected state.

Subsequently, the measurement of the transport position of the execution device 100 is started by the method described above (STEP ST10), and the electrostatic capacitance value is measured (STEP ST11). While the electrostatic capacitance is measured, it is determined whether the acceleration measured by the acceleration sensor 190 exceeds the reference range (STEP ST12). That is, it is determined whether the process of transporting the execution device 100 from the electrostatic chuck ESC to the FOUP is started by the transport devices TU1 and TU2. When the acceleration is determined to exceed the reference range, the electrostatic capacitance sensor is stopped (STEP ST13). That is, the switch 198 is disconnected, and the supply of the power from the power supply 177 to the sensor output acquisition circuit 195 is stopped. Then, the data indicating the result of measurement of the position is transmitted to, for example, an external computer (STEP ST14), and the operation ends.

As described above, in an exemplary embodiment, the execution device 100 is provided, which is transported by the transport devices TU1 and TU2 provided in the processing system 1 and executes the predetermined operation. The execution device 100 includes the first sensing probe 104 and the second sensing probe 105 which are the operation devices, the acceleration sensor 190, and the processor 174. The acceleration sensor 190 measures the acceleration applied to the execution device 100. The processor 174 measures the elapsed time after the acceleration measured by the acceleration sensor 190 becomes a value within the reference range. When the predetermined time elapses while the acceleration remains a value within the reference range, and the execution device 100 supplies the power to the sensor output acquisition circuit 195. That is, the measurement of the electrostatic capacitance by the first sensing probe 104 and the second sensing probe 105 is executed.

In the execution device 100 described above, the acceleration applied to the execution device 100 can be detected by the acceleration sensor 190. For example, when the execution device 100 is transported by transport devices TU1 and TU2 of the processing system 1, the acceleration is applied to the execution device 100 according to the change in speed. In addition, in the state where the execution device 100 is mounted on the electrostatic chuck ESC, the execution device 100 is stationary, and acceleration is not applied to the execution device 100.

The processor 174 can determine whether or not the acceleration generated by the movement by the transport devices TU1 and TU2 is applied to the execution device 100. When the predetermined time is not elapsed in a state where the acceleration does not exceed the reference range, that is, in a state where the acceleration due to movement is not applied to the execution device 100, the processor 174 can determine that the execution device 100 is mounted on the electrostatic chuck ESC. Based on this determination, the execution device 100 executes the measurement of the electrostatic capacitance by the first sensing probe 104 and the second sensing probe 105. In this way, the execution device 100 can automatically execute the predetermined operation.

When executing the measurement of the electrostatic capacitance by the first sensing probe 104 and the second sensing probe 105, it is necessary to supply the power to the sensor output acquisition circuit 195. In the execution device 100 described above, during the transport of the execution device 100 by the transport devices TU1 and TU2, the supply of the power to the sensor output acquisition circuit 195 is stopped. Therefore, the power consumption in the execution device 100 can be reduced.

In an exemplary embodiment, the processor 174 may stop the measurement of the elapsed time when the acceleration exceeds the reference range within the predetermined time from start of measurement of elapsed time. For example, when the transport is temporarily stopped during the transport of the execution device 100 by the transport device TU1 and TU2, the processor 174 turns on the timer and starts the measurement of the elapsed time. Even in this case, when the transport is restarted, since the measurement of the elapsed time is stopped, an erroneous determination that the execution device 100 is transported on the electrostatic chuck ESC can be prevented.

In an exemplary embodiment, when the acceleration exceeds the reference range after the measurement of the electrostatic capacitance is executed by the first sensing probe 104 and the second sensing probe 105, the processor 174 determines that the execution device 100 is transported out from the electrostatic chuck ESC. In this case, the supply of the power to the sensor output acquisition circuit 195 is stopped such that the measurement of the electrostatic capacitance by the first sensing probe 104 and the second sensing probe 105 is stopped. By stopping the supply of the power to the sensor output acquisition circuit 195 while the execution device 100 is transported out, an increase in power consumption can be suppressed.

In an exemplary embodiment, the acceleration sensor 190 includes a first acceleration sensor 190X and a second acceleration sensor 190Y. The first acceleration sensor 190X measures the first acceleration in the first direction along the horizontal direction. The second acceleration sensor 190Y measures the second acceleration in the second direction orthogonal to the first direction along the horizontal direction. By providing the first acceleration sensor 190X and the second acceleration sensor 190Y, the acceleration applied to the execution device 100 by the transport of the transport devices TU1 and TU2 can be reliably detected.

In an exemplary embodiment, the reference range may be a range between $-0.005$ m/s$^2$ and $0.005$ m/s$^2$. In this configuration, it can be appropriately determined whether or not the execution device 100 is transported by the transport devices TU1 and TU2.

In an exemplary embodiment, the set time in STEP ST7 may be equal to or longer than 60 seconds. For example, even if the transport is temporarily stopped during the transport of the execution device 100 by the transport devices TU1 and TU2, in a general semiconductor manufacturing apparatus, the transport is restarted before elapsing 60 seconds. Therefore, even when the processor 174 erroneously turns on the timer, an erroneous determination that the execution device 100 is transported on the electrostatic chuck ESC can be prevented. The transport device of the processing system 1 is controlled such that the execution device 100 is returned to the FOUP from the electrostatic chuck ESC after the execution device 100 is mounted on the electrostatic chuck ESC and after a certain period of time longer than the above-described set time elapses.

In an exemplary embodiment, the execution device 100 may supply the power to the electrostatic capacitance sensor to perform capacitance measurements. The operation device for executing the predetermined operation may be another measurement device or sensor such as an imaging device for imaging the surroundings of the execution device or a laser sensor for measuring the distance to the object. That is, after STEP ST8 in FIG. 12, the execution device 100 may start supplying electric power to the other measuring devices and sensors to perform a predetermined measurement. Further, the operation device for performing the predetermined operation may be a reference light source used for calibration of the spectroscopic measuring instrument. Such a reference light source may be configured using a plurality of light sources, such as LEDs, that emit light of different wavelengths. That is, the execution device 100 may start supplying electric power to the plurality of light sources after step ST8 in FIG. 12.

Although various exemplary embodiments are described above, without being limited to the exemplary embodiments described above, various omissions, substitutions, and changes may be made.

For example, the execution device 100 may further include a third acceleration sensor that detects acceleration in a Z-axis direction orthogonal to both the X-axis and the Y-axis.

In addition, the acceleration output by the acceleration sensor may be indicated by an absolute value. For example, the total value of the detection value of the first acceleration sensor 190X and the detection value of the second acceleration sensor 190Y may be an absolute value of the sum of the vectors of the acceleration measured by the first acceleration sensor 190X and the acceleration measured by the second acceleration sensor 190Y. In this case, the reference range of the acceleration may be defined as a range from zero to a positive threshold value.

From the foregoing description, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the aspects following claims.

What is claimed is:

1. An execution device that is transported by a transport device provided in a semiconductor manufacturing apparatus and executes a predetermined operation, the device comprising:
   a disc-shaped base board;
   an operation device provided on the base board and configured to execute the predetermined operation;
   an acceleration sensor provided on the base board and configured to measure acceleration applied to the execution device; and
   an arithmetic device provided on the base board, configured to measure an elapsed time after the acceleration measured by the acceleration sensor becomes a value within a reference range, configured to determine that the execution device is transported to a predetermined position when a predetermined time elapses while the acceleration remains a value within the reference range, and configured to cause the operation device to execute the predetermined operation.

2. The execution device according to claim 1,
   wherein, when the acceleration exceeds the reference range within the predetermined time from start of measurement of the elapsed time, the arithmetic device stops the measurement of the elapsed time and returns the elapsed time to an initial state.

3. The execution device according to claim 1,
   wherein the acceleration sensor includes
   a first acceleration sensor configured to measure first acceleration in a first direction along a horizontal direction, and
   a second acceleration sensor configured to measure second acceleration in a second direction orthogonal to the first direction along the horizontal direction, and the acceleration is a composite value of the first acceleration and the second acceleration.

4. The execution device according to claim 1, wherein, when the acceleration exceeds the reference range after the operation device executes the predetermined operation by the arithmetic device, the arithmetic device determines that the execution device is transported out from the predetermined position, and causes the operation device to stop the predetermined operation.

5. The execution device according to claim 1, wherein the reference range is a range between $-0.005$ m/s$^2$ and $0.005$ m/s$^2$.

6. The execution device according to claim 1, wherein the predetermined time is equal to or longer than 60 seconds.

7. The execution device according to claim 1, wherein the predetermined operation is measurement of an electrostatic capacitance.

8. The execution device according to claim 1, wherein the predetermined position is a stage of the semiconductor manufacturing apparatus.

9. An execution method of causing an execution device transported by a transport device provided in a semiconductor manufacturing apparatus to execute a predetermined operation, the method comprising:
measuring an elapsed time after acceleration applied to the execution device becomes a value within a reference range by measuring the acceleration applied to the execution device; and
determining that the execution device is transported to a predetermined position when a predetermined time elapses from start of measurement of the elapsed time while the acceleration does not exceed the reference range, and executing the predetermined operation,
wherein the measuring and the determining are performed by an arithmetic device provided on a base board of the execution device.

10. The execution method according to claim 9, further comprising:
stopping the measurement of the elapsed time and returning the elapsed time to an initial state when the acceleration exceeds the reference range within the predetermined time from the start of measurement of the elapsed time.

11. The execution method according to claim 9, wherein the acceleration is a composite value of first acceleration in a first direction along a horizontal direction and second acceleration in a second direction orthogonal to the first direction along the horizontal direction.

12. The execution method according to claim 9, further comprising:
determining that the execution device is transported out from the predetermined position when the acceleration exceeds the reference range after the execution device executes the predetermined operation, and stopping the predetermined operation.

13. The execution method according to claim 9, wherein the reference range is a range between $-0.005$ m/s$^2$ and $0.005$ m/s$^2$.

14. The execution method according to claim 9, wherein the predetermined time is equal to or longer than 60 seconds.

15. The execution method according to claim 9, wherein the predetermined operation is measurement of an electrostatic capacitance.

16. The execution method according to claim 9, wherein the predetermined position is a stage of the semiconductor manufacturing apparatus.

* * * * *